(12) United States Patent
Knarr et al.

(10) Patent No.: US 7,993,987 B1
(45) Date of Patent: Aug. 9, 2011

(54) SURFACE CLEANING USING SACRIFICIAL GETTER LAYER

(75) Inventors: Randolph F. Knarr, Putnam Valley, NY (US); Christian Lavoie, Pleasantville, NY (US); Ahmet S. Ozcan, Pleasantville, NY (US); Filippos Papadatos, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/904,346

(22) Filed: Oct. 14, 2010

(51) Int. Cl.
*H01L 21/28* (2006.01)

(52) U.S. Cl. ........ 438/143; 438/402; 438/476; 438/655; 438/664; 438/683; 257/E21.318; 257/E21.593

(58) Field of Classification Search .................... 438/58, 438/143, 310, 402, 476, 649, 651, 655, 664, 438/682, 683, FOR. 146, FOR. 360; 257/E21.318, 257/E21.593
See application file for complete search history.

(56) References Cited

U.S. PATENT DOCUMENTS

| | | | | |
|---|---|---|---|---|
| 4,561,171 | A * | 12/1985 | Schlosser | 438/58 |
| 5,940,735 | A * | 8/1999 | Mehta et al. | 438/783 |
| 5,989,984 | A | 11/1999 | Anderson et al. | |
| 6,060,766 | A * | 5/2000 | Mehta et al. | 257/639 |
| 6,090,645 | A * | 7/2000 | Hamada | 438/143 |
| 6,166,428 | A * | 12/2000 | Mehta et al. | 257/636 |
| 6,228,748 | B1 * | 5/2001 | Anderson et al. | 438/476 |
| 6,524,911 | B1 * | 2/2003 | Mehta | 438/257 |
| 2002/0151170 | A1 * | 10/2002 | Maex et al. | 438/638 |
| 2003/0027420 | A1 * | 2/2003 | Lai et al. | 438/655 |
| 2009/0152651 | A1 | 6/2009 | Bu et al. | |
| 2010/0048010 | A1 | 2/2010 | Chen et al. | |

* cited by examiner

*Primary Examiner* — George Fourson
(74) *Attorney, Agent, or Firm* — Yuanmin Cai; Hoffman Warnick LLC

(57) ABSTRACT

A method includes providing a substrate including a non-insulative, silicon-including region for silicidation, the substrate including one or more contaminants at a top surface thereof. A getter layer is deposited over the non-insulative, silicon-including region, the getter layer reacting with at least one of the one or more contaminants in the non-insulative, silicon-including region at approximately room temperature. The getter layer is removed, and siliciding of the non-insulative, silicon-including region is performed.

20 Claims, 2 Drawing Sheets

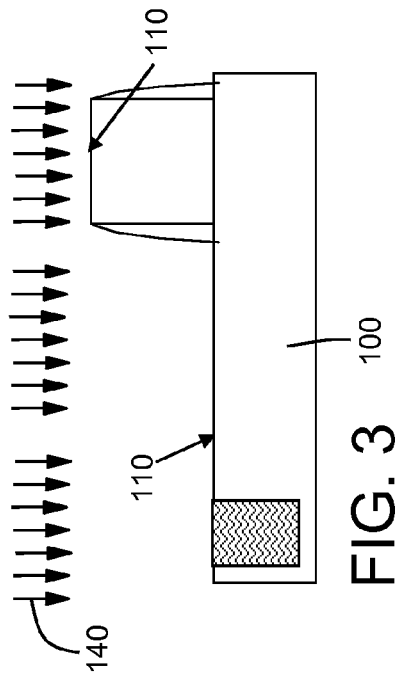
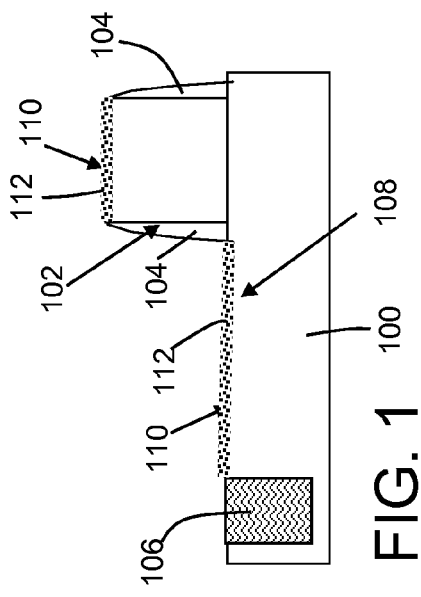
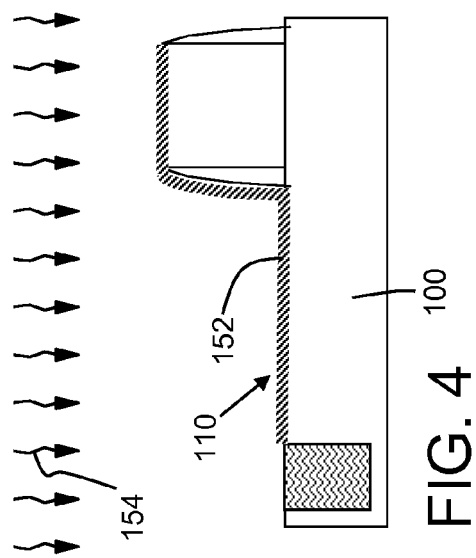

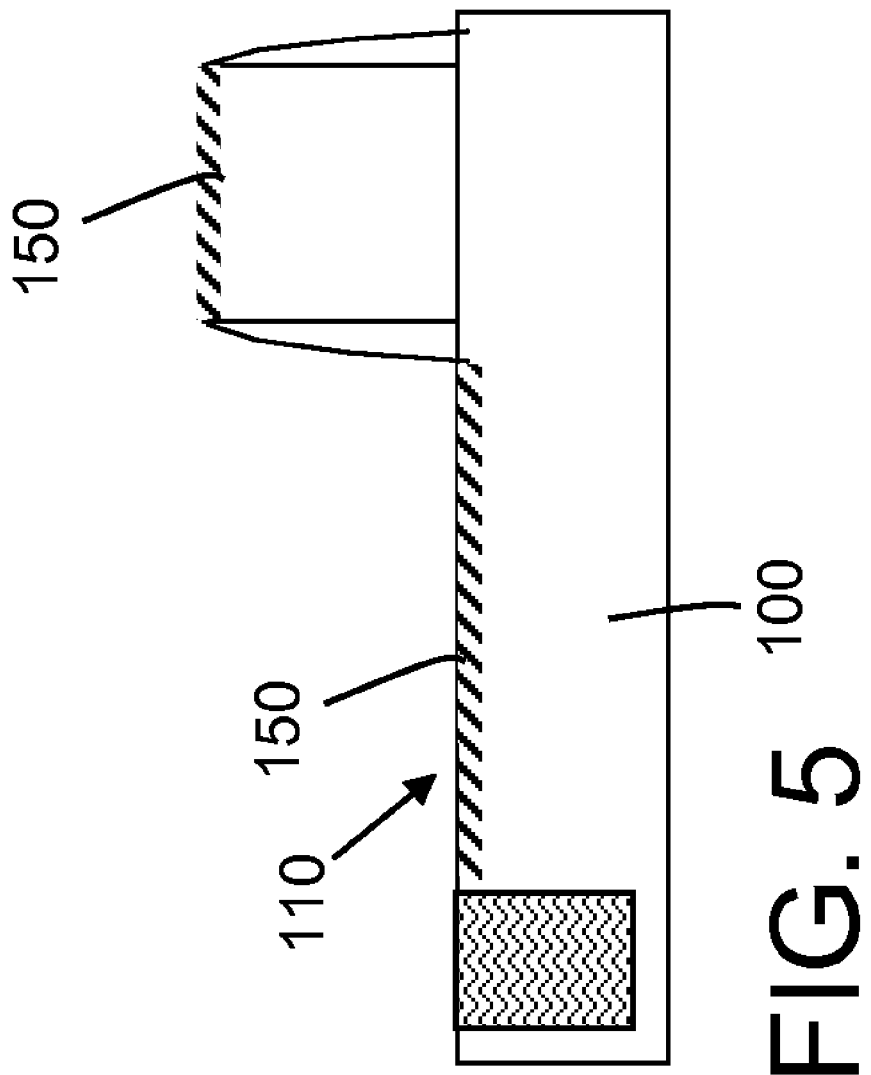

US 7,993,987 B1

SURFACE CLEANING USING SACRIFICIAL GETTER LAYER

BACKGROUND

1. Technical Field

The disclosure relates generally to silicidation processing, and more particularly, to surface cleaning prior to siliciding using a sacrificial getter layer.

2. Background Art

Silicide is an alloy of a metal, e.g., nickel (Ni), and silicon (Si) that typically provides quality electrical contact between a structure in a silicon substrate and a metal contact thereto. Surface cleaning and preparation is required for silicide contact formation. During formation of the structure in the silicon substrate, residual materials left over can block the formation of silicide and cause device and yield degradation. Typically, several cleaning steps have been employed for pre-cleaning, which includes wet and dry cleaning procedures. In order to achieve high process and product yields, significant amounts of overreach into adjacent gate spacers and isolation regions is required during the wet and dry cleaning procedures. For 32 nanometer and smaller technology nodes, in order to achieve appropriate yields, the amount of pre-cleaning used is reduced in order to preserve spacer and shallow trench isolation (STI) oxide, which may not result in all contaminants being adequately removed.

BRIEF SUMMARY

A first aspect of the disclosure provides a method comprising providing a substrate including a non-insulative, silicon-including region for silicidation, the substrate including one or more contaminants at a top surface thereof; depositing a getter layer over the non-insulative, silicon-including region, the getter layer reacting with at least one of the one or more contaminants in the non-insulative, silicon-including region at approximately room temperature; removing the getter layer; and siliciding the non-insulative, silicon-including region.

A second aspect of the disclosure provides a method comprising: providing a silicon substrate including a non-insulative, silicon-including region for silicidation and a dielectric region adjacent thereto, the non-insulative, silicon-including region including one or more contaminants therein; depositing a getter layer over the non-insulative, silicon-including region, the getter layer reacting with the one or more contaminants in the non-insulative, silicon-including region at approximately room temperature to form a layer of getter material compound at the surface of the non-insulative, silicon-including region; removing the getter layer; and siliciding the non-insulative, silicon-including region.

A third aspect of the disclosure provides a method comprising: providing a silicon substrate including a non-insulative, silicon-including region for silicidation and a dielectric region adjacent thereto, the non-insulative, silicon-including region including one or more contaminants therein; depositing a titanium getter layer over the non-insulative, silicon-including region, the titanium getter layer reacting with the one or more contaminants in the non-insulative, silicon-including region at approximately room temperature to form a layer of titanium alloy at the surface of the non-insulative, silicon-including region, and wherein the titanium getter layer has a thickness of approximately 5 to 50 Angstroms; annealing the substrate; removing at least one of the titanium getter layer and the titanium alloy layer after the annealing, the removing including performing a wet etch that does not etch a dielectric region adjacent to the non-insulative, silicon-including region; and siliciding the non-insulative, silicon-including region.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1 shows a substrate after preliminary complimentary metal-oxide semiconductor (CMOS) processing.

FIG. 2 shows the substrate after deposition of a getter layer according to embodiments of the invention.

FIG. 3 shows the substrate after removal of the getter layer.

FIGS. 4-5 show the substrate during a silicidation process.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As indicated above, the disclosure provides a method for surface cleaning using a sacrificial getter layer prior to siliciding. Referring to the drawings, FIG. 1 shows providing a substrate 100 after preliminary complimentary metal-oxide semiconductor (CMOS) processing. In the example illustrated, a gate 102 having a spacer 104 and isolation region 106 adjacent thereto have been formed. Other structures known in the art may also be provided, e.g., source/drain regions, contacts, passive elements, dielectric layers, etc. Substrate 100 may include but is not limited to silicon, germanium, silicon germanium and silicon carbide. Furthermore, a portion or entire semiconductor substrate may be strained.

Substrate 100 also includes a non-insulative, silicon-including region 110 for silicidation, i.e., upon which a silicide is to be formed. In the example shown, regions 110 are provided on top surface of gate 102 and in active regions 108 adjacent thereto. As understood, other regions are also possible. Non-insulative, silicon-including region 110 may include any material listed above for substrate 100 that is non-insulative, i.e., it excludes isolation regions 106 and spacer(s) 104 which although they contain silicon are insulative and not solicited. Non-insulative, silicon-including region 110 may also include one or more contaminants 112 in a top surface thereof. Contaminants 112 can take a variety of forms such as residues of silicon oxide ($SiO_2$) or silicon nitride ($Si_3N_4$).

FIG. 2 shows depositing a getter layer 120 over non-insulative, silicon-including region 110. The "depositing" as used herein may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. In one embodiment, getter layer 120 may include a layer of titanium (Ti), ruthenium (Ru), tantalum (Ta), hafnium (Hf), lanthanum (La) or molybdenum (Mo) that has an ultrathin thickness of approximately 5 to 50 Angstroms. Upon deposition, e.g., using any sputter technique, getter layer 120 enters the top surface of non-insulative, silicon-including region 110 and reacts with the one or more contaminants 112 therein. That is, getter layer 120 readily reacts with whatever is at a surface of region 110 to form a layer of getter material compound 122 at the top surface of region 110 that includes one or more contaminants 112. This reaction may occur at approximately room temperature, e.g., about +/−3° C. from 20° C. Getter material compound 122 may take on a variety of forms depending on the form of contaminant(s) 112 and depending on the type of getter layer 120. For example, where getter layer 120 includes titanium, getter material compound 122 may include titanium nitride ($TiN_x$) (e.g., TiN) and/or titanium oxide ($TiO_x$)(e.g., TiO, $TiO_2$). In another example, if hafnium is used as getter layer 120, getter material compound 122 may take the form $HfN_x$ and/or $HfO_x$.

In an optional process, also shown in FIG. 2, annealing 130 of substrate 100 is illustrated (prior to removing of getter layer 120 (FIG. 3)) Annealing 130 may occur at any temperature suitable for assisting in the reaction of getter layer 120 with contaminant 112. In one example, the annealing may occur at a temperature of less than approximately 150° C.

FIG. 3 shows removing getter layer 120. In one embodiment, the removing includes performing a wet etch 140 that does not etch a dielectric region (e.g., isolation region 106 or spacer(s) 104 (FIG. 1)) adjacent to the non-insulative, silicon-including region 110. One illustrative type of wet etch employs ammonia peroxide, which may be referred to as an SC1 or Huang A clean. This type wet etch does not etch silicon oxide (isolation region 106) or silicon nitride (spacer(s) 104) significantly, but it etches any metals and compounds such as titanium nitride ($TiN_x$) and/or titanium oxide ($TiO_x$). Consequently, removal of getter layer 120 also removes contaminant(s) 112 and/or getter material compound 122 (e.g., in the form of a titanium alloy layer), leaving a clean surface in region 110. The above-described process eliminates the need for a wet etch, e.g., hydrofluoric acid based etch, which would over-etch into isolation region 106 and/or spacers 104.

FIGS. 4-5 show siliciding non-insulative, silicon-including region 110. Silicide 150 (FIG. 5) may be formed using any now known or later developed technique. In one embodiment, as shown in FIG. 4, a metal 152 is deposited such as nickel (Ni), cobalt (Co), titanium (Ti) and/or a binary alloy such as a nickel platinum ($Ni_xPt_{1-x}$) alloy, and substrate 100 is annealed 154 (FIG. 4) to force metal 152 to react with silicon to form silicide 150 (FIG. 5). Unreacted metal is then removed, e.g., using any appropriate etching chemistry such as reactive ion etch or wet etch, resulting in the structure shown in FIG. 5.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from cell phones, toys and other low-end applications to advanced computer products having a display, a keyboard or other input device, and a central processor.

The foregoing drawings show some of the processing associated according to several embodiments of this disclosure. In this regard, each drawing represents a process associated with embodiments of the method described. It should also be noted that in some alternative implementations, the acts noted in the drawings may occur out of the order noted in the figure or, for example, may in fact be executed substantially concurrently or in the reverse order, depending upon the act involved.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   providing a substrate including a non-insulative, silicon-including region for silicidation, the substrate including one or more contaminants at a top surface thereof;
   depositing a getter layer over the non-insulative, silicon-including region, the getter layer reacting with at least one of the one or more contaminants in the non-insulative, silicon-including region at approximately room temperature;
   removing the getter layer; and
   siliciding the non-insulative, silicon-including region.

2. The method of claim 1, wherein the getter layer is selected from the group consisting of: titanium (Ti), ruthenium (Ru), tantalum (Ta), hafnium (Hf), lanthanum (La) and molybdenum (Mo).

3. The method of claim 1, wherein the getter layer has a thickness of approximately 5 to 50 Angstroms.

4. The method of claim 1, further comprising annealing the substrate with the getter layer prior to the removing of the getter layer.

5. The method of claim 1, wherein the getter layer reacts with the non-insulative, silicon-including region and the one or more contaminants to form a layer of getter material compound at the surface of the non-insulative, silicon-including region.

6. The method of claim 5, wherein the getter material compound includes at least one of titanium nitride ($TiN_x$) and titanium oxide ($TiO_x$).

7. The method of claim 1, wherein the removing includes performing a wet etch that does not etch a dielectric region adjacent to the non-insulative, silicon-including region.

8. The method of claim 7, wherein the wet etch includes using ammonia peroxide.

9. The method of claim 1, wherein the siliciding includes:
depositing a metal;
annealing to have the metal react with the substrate; and
removing unreacted metal.

10. The method of claim 9, wherein the metal is selected from the group consisting of: nickel (Ni), cobalt (Co), titanium (Ti) and nickel platinum ($Ni_xPt_{1-x}$) alloy.

11. The method of claim 1, wherein the one or more contaminants include a residue of at least one of silicon oxide ($SiO_2$) or silicon nitride ($Si_3N_4$).

12. A method comprising:
providing a silicon substrate including a non-insulative, silicon-including region for silicidation and a dielectric region adjacent thereto, the non-insulative, silicon-including region including one or more contaminants therein;
depositing a getter layer over the non-insulative, silicon-including region, the getter layer reacting with the one or more contaminants in the non-insulative, silicon-including region at approximately room temperature to form a layer of getter material compound at the surface of the non-insulative, silicon-including region;
removing the getter layer; and
siliciding the non-insulative, silicon-including region.

13. The method of claim 12, wherein the getter layer is selected from the group consisting of: titanium (Ti), ruthenium (Ru), tantalum (Ta), hafnium (Hf), lanthanum (La) and molybdenum (Mo).

14. The method of claim 12, wherein the getter layer has a thickness of approximately 5 to 50 Angstroms.

15. The method of claim 12, further comprising annealing the substrate with the getter layer prior to the removing of the getter layer.

16. The method of claim 12, wherein the removing includes performing a wet etch that does not etch a dielectric region adjacent to the non-insulative, silicon-including region.

17. The method of claim 16, wherein the wet etch includes using ammonia peroxide.

18. The method of claim 12, wherein the siliciding includes:
depositing a metal, the metal selected from the group consisting of: nickel (Ni), cobalt (Co), titanium (Ti) and nickel platinum ($Ni_xPt_{1-x}$) alloy;
annealing to have the metal react with the substrate; and
removing unreacted metal.

19. A method comprising:
providing a silicon substrate including a non-insulative, silicon-including region for silicidation and a dielectric region adjacent thereto, the non-insulative, silicon-including region including one or more contaminants therein;
depositing a titanium getter layer over the non-insulative, silicon-including region, the titanium getter layer reacting with the one or more contaminants in the non-insulative, silicon-including region at approximately room temperature to form a layer of titanium alloy at the surface of the non-insulative, silicon-including region, and wherein the titanium getter layer has a thickness of approximately 5 to 50 Angstroms;
annealing the substrate;
removing at least one of the titanium getter layer and the titanium alloy layer after the annealing, the removing including performing a wet etch that does not etch a dielectric region adjacent to the non-insulative, silicon-including region; and
siliciding the non-insulative, silicon-including region.

20. The method of claim 19, wherein the titanium alloy includes at least one of titanium nitride ($TiN_x$) and titanium oxide ($TiO_x$).

* * * * *